US012615810B2

(12) United States Patent
Hu

(10) Patent No.: US 12,615,810 B2
(45) Date of Patent: Apr. 28, 2026

(54) SUPER JUNCTION POWER DEVICE WITH ADJUSTABLE GATE RESISTANCE STRUCTURE AND MANUFACTURING METHOD THEREOF

(71) Applicant: CHONGQING ALPHA AND OMEGA SEMICONDUCTOR LIMITED, Chongqing (CN)

(72) Inventor: Wei Hu, Chongqing (CN)

(73) Assignee: CHONGQING ALPHA AND OMEGA SEMICONDUCTOR LIMITED, Chongqing (CN)

( * ) Notice: Subject to any disclaimer, the term of this patent is extended or adjusted under 35 U.S.C. 154(b) by 399 days.

(21) Appl. No.: 18/452,576

(22) Filed: Aug. 21, 2023

(65) Prior Publication Data

US 2023/0395652 A1 Dec. 7, 2023

Related U.S. Application Data

(63) Continuation of application No. PCT/CN2022/079226, filed on Mar. 4, 2022.

(30) Foreign Application Priority Data

Mar. 12, 2021 (CN) .......................... 202110271644.4

(51) Int. Cl.
*H10D 62/10* (2025.01)
*H10D 62/13* (2025.01)
(Continued)

(52) U.S. Cl.
CPC ......... *H10D 62/111* (2025.01); *H10D 62/157* (2025.01); *H10D 62/393* (2025.01); *H10D 64/519* (2025.01)

(58) Field of Classification Search
CPC .. H10D 62/111; H10D 62/157; H10D 62/393; H10D 62/051; H10D 62/052;
(Continued)

(56) References Cited

U.S. PATENT DOCUMENTS 8,558,305 B2 * 10/2013 Zara ..................... H10D 64/117
257/334
10,529,813 B2 * 1/2020 Sagawa ................ H10D 12/031
(Continued)

FOREIGN PATENT DOCUMENTS

CN 102842608 A 12/2012
CN 104795445 A 7/2015
(Continued)

OTHER PUBLICATIONS

International Search Report issued in corresponding International application No. PCT/CN2022/079226, mailed Apr. 28, 2022.
(Continued)

*Primary Examiner* — Dao H Nguyen

(57) ABSTRACT

A super junction power device with an adjustable gate resistance structure and a manufacturing method thereof relate to a field of manufacturing of power devices and semiconductors. The manufacturing method includes preparing a cell structure and an adjustable gate resistance structure of the super junction power device; preparing contact through holes; preparing a metal wire layer; and preparing a passivation layer. By designing an adjustable gate resistance structure, a gate resistance of the super junction power device is flexibly adjusted within a certain gate resistance range based on application requirements, further improving an application range of the super junction power device. Through adjustable gate resistance control electrodes, open-circuit control is performed on corresponding independent gate resistors to realize an adjustment of the corresponding gate resistor, There is no need to change a layout of a gate, contact holes, and metal wire layers for different gate resistance requirements.

9 Claims, 1 Drawing Sheet

(51) Int. Cl.
    *H10D 62/17*       (2025.01)
    *H10D 64/27*       (2025.01)

(58) Field of Classification Search
    CPC .... H10D 64/519; H10D 64/01; H10D 64/512;
                   H10D 84/141; H10D 30/0291; H10D
                   30/60; H10D 30/027; H10D 1/47
    See application file for complete search history.

(56)               References Cited

U.S. PATENT DOCUMENTS

| | | | |
|---|---|---|---|
| 2008/0315297 A1* | 12/2008 | Takashita | H10D 62/53 |
| | | | 257/E29.256 |
| 2010/0264489 A1* | 10/2010 | Ohta | H10D 30/668 |
| | | | 257/334 |
| 2012/0217555 A1* | 8/2012 | Saito | H10D 84/141 |
| | | | 257/288 |
| 2020/0279911 A1 | 9/2020 | Kim | |
| 2024/0178275 A1* | 5/2024 | Hu | H01L 21/3213 |

FOREIGN PATENT DOCUMENTS

| | | |
|---|---|---|
| CN | 112447879 A | 3/2021 |
| CN | 113035701 A | 6/2021 |

OTHER PUBLICATIONS

Written Opinion of the International Search Authority in corresponding International application No. PCT/CN2022/079226, mailed Apr. 28, 2022.

\* cited by examiner

SUPER JUNCTION POWER DEVICE WITH ADJUSTABLE GATE RESISTANCE STRUCTURE AND MANUFACTURING METHOD THEREOF

TECHNICAL FIELD

The present disclosure relates to a field of manufacturing of power devices and semiconductors, and in particular to a super junction power device with an adjustable gate resistance structure and a manufacturing method thereof.

BACKGROUND

As a problem of the greenhouse effect becomes more and more prominent, a demand for energy conservation and emission reduction in various countries is increasing, which also puts forward requirements for reducing power consumption of electronic products. To comply with the requirements for reducing the power consumption, super junction structures are introduced into conventional power devices. The super junction structures reduce an on-resistance by 50%-65% under a premise of achieving same withstand voltage, effectively reducing the power consumption and improving an operation efficiency of the electronic products. Especially in high-power power supply products, advantages of the super junction structures are prominent.

The Chinese patent application No. CN104952928A discloses a super junction power device with slowly changing gate-to-drain capacitance and a manufacturing method thereof. Cgd (Capacitance-Gate-Drain) is reduced by reducing an overlapping area between a gate of the metal-oxide-semiconductor field-effect transistor (MOS) device and a substrate thereof. However, a structure of the super junction power device is fixed after a wafer thereof is produced.

The Chinese patent application No. CN104795445A discloses a super-junction power device with low loss and a manufacturing method thereof. By reducing a gate resistance thereof, a switching speed of the super-junction power device is improved and a switching loss is reduced. However, increasing of a driving speed must be matched with circuit design requirements. If not, it may cause interference between different devices in a circuit thereof. In severe cases, the circuit works abnormally. Therefore, it is necessary to select the super junction power device with corresponding gate resistances according to the circuit design requirements. The gate resistance is usually fixed after a production of the super junction power device is completed, so the gate resistance is unable to be changed based on circuit adjustment requirements in application scenarios.

SUMMARY

A purpose of the present disclosure is to provide a super junction power device with an adjustable gate resistance structure and a manufacturing method thereof to solve a technical problems in the prior art.

To achieve the above purpose, the present disclosure provides the manufacturing method of the super junction power device with the adjustable gate resistance structure. The manufacturing method comprises following steps:

A: preparing a cell structure and an adjustable gate resistance structure of the super junction power device;

B: preparing contact through holes;

C: preparing a metal wire layer; and

D: preparing a passivation layer.

Optionally, the step A comprises steps:

S1: depositing an intrinsic epitaxial layer on a surface of a silicon substrate by chemical vapor deposition (CVD); doping first-type ions on the intrinsic epitaxial layer through an ion implantation process;

S2: depositing a first mask on an upper surface of the intrinsic epitaxial layer, where the first mask is a photoresist or a multi-layer combined structure composed of a photoresist and other insulator masks;

S3: defining column-shaped region patterns on the first mask by photolithography process; doping second-type ions on the intrinsic epitaxial layer through the ion implantation process; removing the first mask by dry etching and wet etching;

S4: performing the steps S1-S3 repeatedly;

S5: growing a gate oxide layer by thermal oxidation method, and then depositing gate polysilicon by low-pressure CVD, where the gate polysilicon is a first-type in-situ doped gate polysilicon;

S6: depositing a second mask on the gate polysilicon, where the second mask is the photoresist or the multi-layer combined structure composed of the photoresist and other insulator masks; defining a gate pattern on the second mask by the photolithography process, forming a gate structure by the dry etching; and removing the second mask by the dry etching and the wet etching;

S7: injecting the first-type ions on the upper surface of the intrinsic epitaxial layer by the ion implantation process; and activating the first-type ions in the intrinsic epitaxial layer by a thermal process to obtain body regions;

S8: depositing a third mask on an upper surface of a doped intrinsic epitaxial layer, where the third mask is the photoresist or the multi-layer combined structure composed of the photoresist and other insulator masks; defining a pattern of source regions on the third mask by the photolithography process; injecting the first-type ions on upper surfaces of the body regions by the ion implantation process to obtain a source; removing the third mask by the dry etching and the wet etching; activating the first-type ions in the source regions by the thermal process; and S9: injecting the second-type ions on the upper surface of the intrinsic epitaxial layer through the ion implantation process to obtain an ohmic contact region, where the ohmic contact region is highly doped, and finally obtaining the cell structure and the adjustable gate resistance structure.

The gate pattern defines a gate pattern of a cell region metal oxide field effect transistor and adjustable gate resistance structure pattern regions. The adjustable gate resistance structure pattern regions are independent patterns of gate resistors with a line width of 5 um. The adjustable gate resistance structure pattern regions are connected in series to three independent gate resistors connected in parallel in a gate loop to make an adjusting range of a resistance of the independent gate resistors to be 1-30Ω.

Optionally, in the steps S1, S3, S7, S8 and S9, a doping type of the first-type ions is opposite to a doping type of the second-type ions; the first-type ions are N-type ions or P-type ions, and the second-type ions are according P-type ions or N-type ions; the P-type ions are trivalent boron element and the N-type ions are pentavalent arsenic element or pentavalent phosphorus element.

Optionally, in the step S4, steps S1-S3 are repeatedly performed until a thickness of the intrinsic epitaxial layer is 30-70 um.

Optionally, a thickness of the gate oxide layer in the step S5 is 50-200 nm. A thickness of the gate polysilicon in the step S5 is 500-1000 nm.

Optionally, the step B specifically comprises following steps:

S10: forming a silicon dioxide dielectric layer by the CVD;

S11: defining a pattern of a source region contact hole, a pattern of a gate region contact hole, and a pattern of adjustable gate resistance structure contact holes by the photoresist through the photolithography process, where the pattern of the source region contact hole is disposed above the source and the body regions; and the pattern of the source region contact hole is configured to lead out the source and the body regions; the pattern of the gate region contact hole is disposed above the gate polysilicon; defining regions of passive region contact holes in the source regions for placing gate metal blocks; the pattern of the adjustable gate resistance structure contact holes are disposed above the gate resistor adjustable structure and is configured to connect the gate region and the adjustable gate resistance structure;

S12: etching the silicon dioxide dielectric layer by the dry etching to obtain the source region contact hole, the gate region contact hole, and the adjustable gate resistance structure contact holes;

S13: depositing a metal as an adhesive layer by a physical vapor deposition (PVD), depositing a metal nitride as a barrier layer; and forming a silicide by a rapid thermal degradation process, wherein the metal comprises one or more of titanium, cobalt, and tantalum; and S14: depositing tungsten by a tungsten plug process, removing the tungsten outside the source region contact hole, the gate region contact hole, and the adjustable gate resistance structure contact holes by the dry etching; and forming tungsten plugs in the source region contact hole, the gate region contact hole, and the adjustable gate resistance structure contact holes.

Optionally, the step C comprises:

S15: depositing aluminum-copper compounds respectively on the tungsten plugs by the PVD; defining a pattern of a source metal wires, a pattern of a gate metal wires, and a pattern of adjustable gate resistance structure control electrodes by the photoresist through the photolithography process; obtaining a source, a gate, and the adjustable gate resistance structure control electrodes by the dry etching.

The pattern of the source metal wires is disposed above the source regions. The pattern of the gate metal wires is disposed around an edge of a cell region, so that the gate is connected to the region of the passive region contact hole of the source regions through the gate region contact hole to form the gate metal blocks.

The pattern of the adjustable gate resistance structure control electrodes connected the adjustable gate resistance structure in parallel between the gate region contact hole and the gate metal blocks through the adjustable gate resistance structure contact holes and first metal wires. Each of the adjustable gate resistance structure control electrodes is led out between a corresponding independent gate resistor and a corresponding gate metal block. The adjustable gate resistance structure control electrodes are one-to-one corresponding to the independent gate resistors.

Optionally, in the step S15, a line width of second metal wires of joints of independent gate resistor metal wires and corresponding adjustable gate resistance structure control electrode metal wires to be 1-2 um. The second metal wires are configured to connect to the gate metal blocks.

Optionally, the step D comprises:

S16: depositing the passivation layer; defining a source metal contact region, a gate metal contact region, and adjustable gate resistance structure control electrode contact regions by the photoresist through the photolithography process; obtaining the source metal contact region, the gate metal contact region, and the adjustable gate resistance structure control electrode contact regions through the dry etching.

The adjustable gate resistance structure control electrode contact regions are one-to-one corresponding the independent gate resistors. The passivation layer comprises silicon nitride and/or silicon dioxide.

A first-type doping and a second-type doping are opposite doping types. If the first-type doping is N-type doping, then the second-type doping is P-type doping. If the first-type doping is P-type doping, then the second-type doping is N-type doping.

The present disclosure further provides a super junction power device with an adjustable gate resistance structure. The super junction power device is manufactured by the manufacturing method mentioned above.

Compared with the prior art, in the present disclosure, there is no need to change a layout of the gate, the contact holes, and metal wire layers for different gate resistance requirements, and is no need to re-make masks or tape out, which reduces costs.

Further, through each of the adjustable gate resistance control electrodes, open-circuit control is performed on the corresponding independent gate resistor to realize an adjustment of the corresponding gate resistor.

Furthermore, the present disclosure improves versatility of super junction power device in application. In a conventional super junction power device of the prior art, Cgd is reduced by reducing an overlapping area of a gate of a MOS device and a substrate thereof, and an electrical performance of the conventional super junction power device is fixed after a wafer thereof is produced. In the present disclosure, Rg (gate resistance) is adjusted by adjusting the number of the independent gate resistors connected in parallel in the gate loop. After a wafer thereof is produced, Rg is adjusted by applying a current through a corresponding adjustable gate resistance control electrode to fuse a specified gate resistor and the metal wires in series with the gate based on requirements.

BRIEF DESCRIPTION OF DRAWINGS

Other characteristics, objects, and advantages of the present disclosure will become more apparent by referring to detailed descriptions of non-limiting embodiments and following drawings.

In the drawings.

Figure 1:
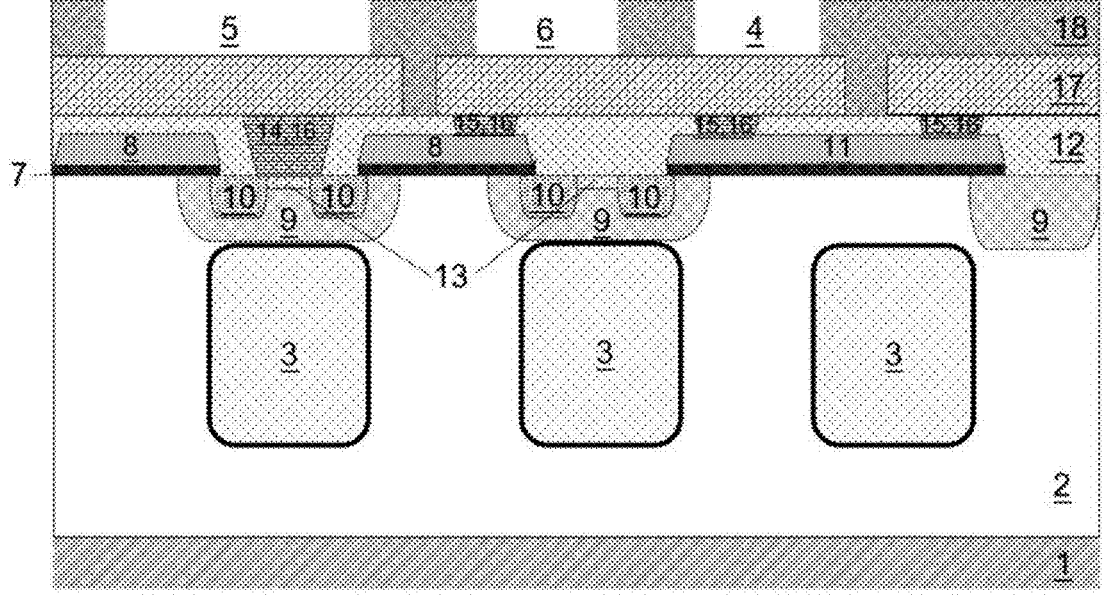
FIG. 1 is a structural schematic diagram of a super junction power device with an adjustable gate resistance structure according to embodiments 1-3 of the present disclosure.
Figure 2:
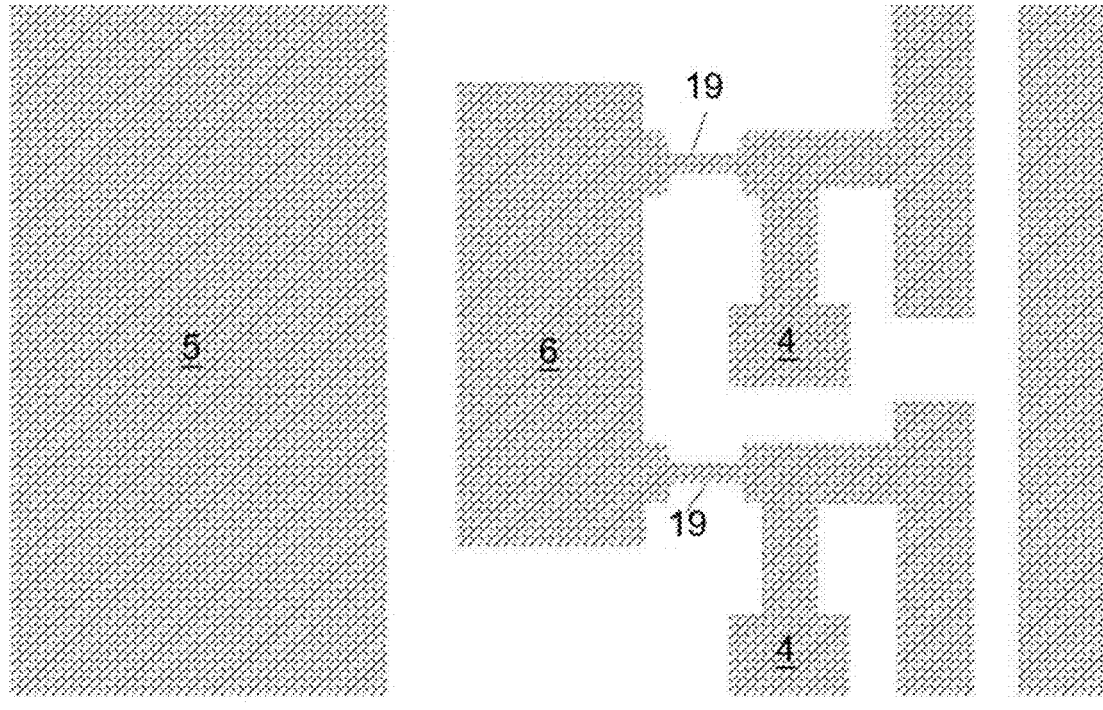
FIG. 2 is a top plan schematic diagram of a layout of a metal layer of the super junction power device with the adjustable gate resistance structure according to embodiments 1-3 of the present disclosure.

1—silicon substrate; 2—intrinsic epitaxial layer; 3—column-shaped region patterns; 4—adjustable gate resistance structure control electrode; 5—source; 6—gate; 7—gate oxide layer; 8—gate polysilicon; 9—body region; 10—source region; 11—gate resistor; 12—silicon dioxide dielectric layer; 13—ohmic contact region; 14—body region/source region contact hole; 15—gate region contact hole; 16—tungsten plug; 17—aluminum-copper compound; 18—passivation layer; 19—adjustable gate resistance structure pattern region.

DETAILED DESCRIPTION

The following embodiments will help those skilled in the art to further understand the present disclosure, but do not limit the present disclosure in any form. Those skilled in the art can make changes and improvements without departing from the concept of the present disclosure, all of which should fall within the protection scope of the present disclosure. The endpoints and any values of ranges disclosed herein are not limited to the precise range or value, which should be understood to include values close to the ranges or values. For a numerical range, one or more new numerical ranges may be obtained by combining endpoint values of various ranges, endpoint values of various ranges, separate point values, and separate point values, which should be considered as specifically disclosed by the present disclosure. The present disclosure is described in detail below with reference to specific embodiments.

Embodiment 1

In the embodiment, the present disclosure provides a super junction power device with an adjustable gate resistance structure and a manufacturing method thereof. The manufacturing method comprises following steps:

S1: depositing an intrinsic epitaxial layer 2 on a surface of a silicon substrate 1 by chemical vapor deposition (CVD); doping first-type ions on the intrinsic epitaxial layer 1 through an ion implantation process;

In the embodiment, the silicon substrate 1 is N-type silicon substrate, and the first-type ions are N-type ions. Specifically, the first-type ions are pentavalent element. The pentavalent element comprises arsenic and/or phosphorus. In the step S1, the pentavalent element is phosphorus.

S2: depositing a first mask on an upper surface of the intrinsic epitaxial layer 2, where the first mask is a photoresist or a multi-layer combined structure composed of a photoresist and other insulator masks;

S3: defining column-shaped region patterns 3 on the first mask by photolithography process; doping second-type ions on the intrinsic epitaxial layer 2 through the ion implantation process; removing the first mask by dry etching and wet etching;

In the embodiment, the column-shaped region patterns 3 are P-type region patterns. The second-type ions are P-type ions. Specifically, the second-type ions are trivalent element, and the trivalent element is boron.

S4: performing the steps S1-S3 repeatedly until a thickness of the intrinsic epitaxial layer 2 is 50 um;

When repeatedly preforming the steps S1-S3 in the step S4, process conditions for the ion implantation process of the trivalent elements and the pentavalent element are individually defined according to device design requirements.

S5: growing a gate oxide layer 7 by thermal oxidation method, and then depositing gate polysilicon 8 by low-pressure CVD, where the gate polysilicon 8 is in-situ doped gate polysilicon;

In the embodiment, the gate polysilicon 8 is N-type gate polysilicon 8. A thickness of the gate oxide layer 7 is 80 nm. A thickness of the gate polysilicon 8 is 700 nm.

S6: depositing a second mask on the gate polysilicon 8, where the second mask is the photoresist or the multi-layer combined structure composed of the photoresist and other insulator masks; defining a gate pattern on the second mask by the photolithography process, forming a gate structure by the dry etching; and removing the second mask by the dry etching and the wet etching.

The gate pattern defines a gate pattern of a cell region metal oxide field effect transistor and adjustable gate resistance structure pattern regions 19. The adjustable gate resistance structure pattern regions are independent patterns of gate resistors with a line width of 5 um. The adjustable gate resistance structure pattern regions are connected in series to three independent gate resistors 11 connected in parallel in a gate loop to make an adjusting range of a resistance of the independent gate resistors 11 to be 1-30Ω.

S7: injecting the first-type ions on the upper surface of the doped intrinsic epitaxial layer 1 by the ion implantation process to obtain body regions 9; and activating the first-type ions in the body regions 9 by a thermal process;

The first-type ions are the P-type ions. The first-type ions are pentavalent element. The pentavalent element comprises arsenic and/or phosphorus.

S8: depositing a third mask on the upper surface of the doped intrinsic epitaxial layer 2, where the third mask is the photoresist or the multi-layer combined structure composed of the photoresist and other insulator masks; defining a pattern of source regions 10 on the third mask by the photolithography process; injecting the first-type ions on upper surfaces of the body regions 9 by the ion implantation process to obtain a source 5; removing the third mask by the dry etching and the wet etching; activating the first-type ions of the source regions 10 by the thermal process;

The pattern of source regions 10 is a N-type pattern. In the embodiment, the first-type ions are N-type ions. Specifically, the first-type ions are pentavalent element. The pentavalent element comprises arsenic and/or phosphorus. In the step S8, the first-type ions are arsenic.

S9: injecting the second-type ions on the upper surface of the intrinsic epitaxial layer 2 through the ion implantation process to obtain an ohmic contact region 13, where the second-type ions are P-type boron ions, the ohmic contact region 13 is highly doped, and finally obtaining the cell structure and the adjustable gate resistance structure;

S10: forming a silicon dioxide dielectric layer 12 by the CVD;

S11: defining a pattern of a source region contact hole, a pattern of a gate region contact hole, and a pattern of adjustable gate resistance structure contact holes by the photoresist through the photolithography process, where the pattern of the source region contact hole is disposed above the source 5 and the body regions 9; and the pattern of the source region contact hole is configured to lead out the source 5 and the body regions 9; the pattern of the gate region contact hole is disposed above the gate polysilicon 8; defining regions of passive region contact holes in the source regions 10 for placing gate metal blocks; the pattern of the adjustable gate resistance structure contact holes are disposed above the gate resistor adjustable structure and is configured to connect the gate region and the adjustable gate resistance structure;

S12: etching the silicon dioxide dielectric layer 12 by the dry etching to obtain the source region contact hole 14, the gate region contact hole 15, and the adjustable gate resistance structure contact holes 15;

S13: depositing a metal as an adhesive layer by a physical vapor deposition (PVD), depositing a metal nitride as a barrier layer; and forming a silicide by a rapid thermal degradation process, wherein the metal comprises one or more of titanium, cobalt, and tantalum;

In the embodiment, the metal is metal titanium and titanium nitride.

S14: depositing tungsten by a tungsten plug process, removing the tungsten outside the source region contact hole, the gate region contact hole, and the adjustable gate resistance structure contact holes by the dry etching; and forming tungsten plugs 16 in the source region contact hole 14, the gate region contact hole 15, and the adjustable gate resistance structure contact holes 15;

S15: depositing aluminum-copper compounds 17 respectively on the tungsten plugs 16 by the PVD; defining a pattern of a source metal wires, a pattern of a gate metal wires, and a pattern of adjustable gate resistance structure control electrodes by the photoresist through the photolithography process; obtaining the source 5, a gate 6, and the adjustable gate resistance structure control electrodes 4 by the dry etching; and The pattern of the source metal wires is disposed above the source regions 10. The pattern of the gate metal wires is disposed around an edge of a cell region, so that the gate 6 is connected to the region of the passive region contact hole of the source regions 10 through the gate region contact hole 14 to form the gate metal blocks.

The pattern of the adjustable gate resistance structure control electrodes connected the adjustable gate resistance structure in parallel between the gate region contact hole and the gate metal blocks through the adjustable gate resistance structure contact holes and first metal wires. Each of the adjustable gate resistance structure control electrodes is led out between a corresponding independent gate resistor and a corresponding gate metal block.

In the step S15, a line width of second metal wires of joints of independent gate resistor metal wires and corresponding adjustable gate resistance structure control electrode metal wires to be 1.5 um; the second metal wires are configured to connect to the gate metal blocks.

S16: depositing a passivation layer 18; defining a source metal contact region, a gate metal contact region, and adjustable gate resistance structure control electrode contact regions by the photoresist through the photolithography process; obtaining the source metal contact region, the gate metal contact region, and the adjustable gate resistance structure control electrode contact regions through the dry etching.

The independent gate resistors. The passivation layer is silicon dioxide, silicon dioxide, or a combination of silicon nitride and silicon dioxide.

A first-type doping and a second-type doping are opposite doping types. If the first-type doping is N-type doping, then the second-type doping is P-type doping. If the first-type doping is P-type doping, then the second-type doping is N-type doping.

The present disclosure further provides a super junction power device with an adjustable gate resistance structure. The super junction power device is manufactured by the manufacturing method mentioned above.

In the embodiment, the silicon substrate 1 is a first-type silicon substrate, the intrinsic epitaxial layer 2 is a first-type intrinsic epitaxial layer. The column-shaped region patterns 3 are second-type doping patterns. The body regions 9 are second-type body regions, and the source region 10 is a first-type source region. The first-type doping and the second-type doping are opposite doping types. If one first-type element is defined as an N-type element, then a second-type element is defined as a P-type element, and if the first-type element is defined as the P-type element, then the second-type element is the N-type element. The P type element comprises trivalent boron element, and the N type element comprises pentavalent arsenic element or pentavalent phosphorus element.

Finally, the super junction power device with the adjustable gate resistance structure is obtained. There is no need to change a layout of the gate, the contact holes, and metal wire layers for different gate resistance requirements, and is no need to re-make masks or tape out, which reduces costs. Further, through each of the adjustable gate resistance control electrodes 4, open-circuit control is performed on the corresponding independent gate resistor to realize an adjustment of the corresponding gate resistor 11.

Embodiment 2

In the embodiment, the present disclosure provides a super junction power device with an adjustable gate resistance structure and a manufacturing method thereof. The manufacturing method comprises following steps:

S1: depositing an intrinsic epitaxial layer 2 on a surface of a silicon substrate 1 by chemical vapor deposition (CVD); doping first-type ions on the intrinsic epitaxial layer 1 through an ion implantation process;

Specifically, the first-type ions are pentavalent element. The pentavalent element comprises arsenic and/or phosphorus. In the step S1, the pentavalent element is phosphorus.

S2: depositing a first mask on an upper surface of the intrinsic epitaxial layer 2, where the first mask is a photoresist or a multi-layer combined structure composed of a photoresist and other insulator masks;

S3: defining column-shaped region patterns 3 on the first mask by photolithography process; doping second-type ions on the intrinsic epitaxial layer 2 through the ion implantation process; removing the first mask by dry etching and wet etching;

Specifically, the second-type ions are trivalent element, and the trivalent element is boron.

S4: performing the steps S1-S3 repeatedly until a thickness of the intrinsic epitaxial layer 2 is 30 um;

When repeatedly preforming the steps S1-S3 in the step S4, process conditions for the ion implantation process of the trivalent elements and the pentavalent element are individually defined according to device design requirements.

S5: growing a gate oxide layer 7 by thermal oxidation method, and then depositing gate polysilicon 8 by low-pressure CVD, where the gate polysilicon 8 is in-situ doped gate polysilicon;

A thickness of the gate oxide layer 7 is 10 nm. A thickness of the gate polysilicon 8 is 500 nm.

S6: depositing a second mask on the gate polysilicon 8, where the second mask is the photoresist or the multi-layer combined structure composed of the photoresist and other insulator masks; defining a gate pattern on the second mask by the photolithography process, forming a gate structure by the dry etching; and removing the second mask by the dry etching and the wet etching.

The gate pattern defines a gate pattern of a cell region metal oxide field effect transistor and adjustable gate resistance structure pattern regions 19. The adjustable gate resistance structure pattern regions are independent patterns of gate resistors with a line width of 1-10 um. The adjustable gate resistance structure pattern regions are connected in series to 2-5 independent gate resistors 11 connected in parallel in a gate loop to make an adjusting range of a resistance of the independent gate resistors 11 to be 1-30Ω.

S7: injecting the first-type ions on the upper surface of the doped intrinsic epitaxial layer 1 by the ion implantation process to obtain body regions 9; and activating the first-type ions in the body regions 9 by a thermal process;

The first-type ions in the step S7 are pentavalent element. The pentavalent element comprises arsenic and/or phosphorus. In the embodiment, the pentavalent element is arseni.

S8: depositing a third mask on the upper surface of the doped intrinsic epitaxial layer 2, where the third mask is the photoresist or the multi-layer combined structure composed of the photoresist and other insulator masks; defining a pattern of source regions 10 on the third mask by the photolithography process; injecting the first-type ions on upper surfaces of the body regions 9 by the ion implantation process to obtain a source 5; removing the third mask by the dry etching and the wet etching; activating the first-type ions of the source regions 10 by the thermal process;

The pattern of source regions 10 is a N-type pattern. In the embodiment, the first-type ions are N-type ions. Specifically, the first-type ions are pentavalent element. The pentavalent element comprises arsenic and/or phosphorus. In the step S8, the first-type ions are arsenic.

S9: injecting the second-type ions on the upper surface of the intrinsic epitaxial layer 2 through the ion implantation process to obtain an ohmic contact region 13, where the second-type ions are boron ions, the ohmic contact region 13 is highly doped, and finally obtaining the cell structure and the adjustable gate resistance structure;

S10: forming a silicon dioxide dielectric layer 12 by the CVD;

S11: defining a pattern of a source region contact hole, a pattern of a gate region contact hole, and a pattern of adjustable gate resistance structure contact holes by the photoresist through the photolithography process, where the pattern of the source region contact hole is disposed above the source 5 and the body regions 9; and the pattern of the source region contact hole is then configured to lead out the source 5 and the body regions 9; the pattern of the gate region contact hole is disposed above the gate polysilicon 8; defining regions of passive region contact holes in the source regions 10 for placing gate metal blocks; the pattern of the adjustable gate resistance structure contact holes are disposed above the gate resistor adjustable structure and is configured to connect the gate region and the adjustable gate resistance structure;

S12: etching the silicon dioxide dielectric layer 12 by the dry etching to obtain the source region contact hole 14, the gate region contact hole 15, and the adjustable gate resistance structure contact holes 15;

S13: depositing a metal as an adhesive layer by a physical vapor deposition (PVD), depositing a metal nitride as a barrier layer; and forming a silicide by a rapid thermal degradation process, wherein the metal comprises one or more of titanium, cobalt, and tantalum;

In the embodiment, the metal is metal titanium and titanium nitride.

S14: depositing tungsten by a tungsten plug process, removing the tungsten outside the source region contact hole, the gate region contact hole, and the adjustable gate resistance structure contact holes by the dry etching; and forming tungsten plugs 16 in the source region contact hole 14, the gate region contact hole 15, and the adjustable gate resistance structure contact holes 15;

S15: depositing aluminum-copper compounds 17 respectively on the tungsten plugs 16 by the PVD; defining a pattern of a source metal wires, a pattern of a gate metal wires, and a pattern of adjustable gate resistance structure control electrodes by the photoresist through the photolithography process; obtaining the source 5, a gate 6, and the adjustable gate resistance structure control electrodes 4 by the dry etching; and The pattern of the source metal wires is disposed above the source regions 10. The pattern of the gate metal wires is disposed around an edge of a cell region, so that the gate 6 is connected to the region of the passive region contact hole of the source regions 10 through the gate region contact hole 14 to form the gate metal blocks.

The pattern of the adjustable gate resistance structure control electrodes connected the adjustable gate resistance structure in parallel between the gate region contact hole and the gate metal blocks through the adjustable gate resistance structure contact holes and first metal wires. Each of the adjustable gate resistance structure control electrodes is led out between a corresponding independent gate resistor and a corresponding gate metal block.

In the step S15, a line width of second metal wires of joints of independent gate resistor metal wires and corresponding adjustable gate resistance structure control electrode metal wires to be 1 um; the second metal wires are configured to connect to the gate metal blocks.

S16: depositing a passivation layer 18; defining a source metal contact region, a gate metal contact region, and adjustable gate resistance structure control electrode contact regions by the photoresist through the photolithography process; obtaining the source metal contact region, the gate metal contact region, and the adjustable gate resistance structure control electrode contact regions through the dry etching.

The independent gate resistors. The passivation layer is silicon dioxide, silicon dioxide, or a combination of silicon nitride and silicon dioxide.

A first-type doping and a second-type doping are opposite doping types. If the first-type doping is N-type doping, then the second-type doping is P-type doping. If the first-type doping is P-type doping, then the second-type doping is N-type doping.

The present disclosure further provides a super junction power device with an adjustable gate resistance structure. The super junction power device is manufactured by the manufacturing method mentioned above.

In the embodiment, the silicon substrate 1 is a first-type silicon substrate, the intrinsic epitaxial layer 2 is a first-type intrinsic epitaxial layer. The column-shaped region patterns 3 are second-type doping patterns. The body regions 9 are second-type body regions, and the source region 10 is a first-type source region. The first-type and the second-type are opposite doping types. If one first-type element is defined as an N-type element, then a second-type element is defined as a P-type element, and if the first-type element is defined as a P-type element, then the second-type element is the N-type element.

Finally, the super junction power device with the adjustable gate resistance structure is obtained. There is no need to change a layout of the gate, the contact holes, and metal wire layers for different gate resistance requirements, and is no need to re-make masks or tape out, which reduces costs. Further, through each of the adjustable gate resistance control electrodes 4, open-circuit control is performed on the corresponding independent gate resistor to realize an adjustment of the corresponding gate resistor 11.

Embodiment 3

In the embodiment, the present disclosure provides a super junction power device with an adjustable gate resistance structure and a manufacturing method thereof. The manufacturing method comprises following steps:

S1: depositing an intrinsic epitaxial layer 2 on a surface of a silicon substrate 1 by CVD; doping first-type ions on the intrinsic epitaxial layer 1 through an ion implantation process;

Specifically, the first-type ions are pentavalent element. The pentavalent element comprises arsenic and/or phosphorus. In the step S1, the pentavalent element is phosphorus S2: depositing a first mask on an upper surface of the intrinsic epitaxial layer 2, where the first mask is a photoresist or a multi-layer combined structure composed of a photoresist and other insulator masks;

S3: defining column-shaped region patterns 3 on the first mask by photolithography process; doping second-type ions on the intrinsic epitaxial layer 2 through the ion implantation process; removing the first mask by dry etching and wet etching;

Specifically, the second-type ions in the step S3 are trivalent element, and the trivalent element is boron.

S4: performing the steps S1-S3 repeatedly until a thickness of the intrinsic epitaxial layer 2 is 70 um;

When repeatedly preforming the steps S1-S3 in the step S4, process conditions for the ion implantation process of the trivalent elements and the pentavalent element are individually defined according to device design requirements.

S5: growing a gate oxide layer 7 by thermal oxidation method, and then depositing gate polysilicon 8 by low-pressure CVD, where the gate polysilicon 8 is an in-situ doped gate polysilicon;

A thickness of the gate oxide layer 7 is 150 nm. A thickness of the gate polysilicon 8 is 1000 nm.

S6: depositing a second mask on the gate polysilicon 8, where the second mask is the photoresist or the multi-layer combined structure composed of the photoresist and other insulator masks; defining a gate pattern on the second mask by the photolithography process, forming a gate structure by the dry etching; and removing the second mask by the dry etching and the wet etching.

The gate pattern defines a gate pattern of a cell region metal oxide field effect transistor and adjustable gate resistance structure pattern regions 19. The adjustable gate resistance structure pattern regions are independent patterns of gate resistors with a line width of 1-10 um. The adjustable gate resistance structure pattern regions are connected in series to 2-5 independent gate resistors 11 connected in parallel in a gate loop to make an adjusting range of a resistance of the independent gate resistors 11 to be 1-30Ω.

S7: injecting the first-type ions on the upper surface of the doped intrinsic epitaxial layer 1 by the ion implantation process to obtain body regions 9; and activating the first-type ions in the body regions 9 by a thermal process;

The first-type ions are pentavalent element. The pentavalent element comprises arsenic and/or phosphorus. In the step S7, the pentavalent element is phosphorus.

S8: depositing a third mask on the upper surface of the doped intrinsic epitaxial layer 2, where the third mask is the photoresist or the multi-layer combined structure composed of the photoresist and other insulator masks; defining a pattern of source regions 10 on the third mask by the photolithography process; injecting the first-type ions on upper surfaces of the body regions 9 by the ion implantation process to obtain a source 5; removing the third mask by the dry etching and the wet etching; activating the second pentavalent element impurity of the source regions 10 by the thermal process;

The pattern of source regions 10 is an N-type pattern. In the embodiment, the first-type ions are N-type ions. Specifically, the first-type ions are pentavalent element. The pentavalent element comprises arsenic and/or phosphorus. In the step S8, the first-type ions are arsenic.

S9: injecting the second-type ions on the upper surface of the intrinsic epitaxial layer 2 through the ion implantation process to obtain an ohmic contact region 13, where the second-type ions are P-type boron, the ohmic contact region 13 is highly doped, and finally obtaining the cell structure and the adjustable gate resistance structure;

S10: forming a silicon dioxide dielectric layer 12 by the CVD;

S11: defining a pattern of a source region contact hole, a pattern of a gate region contact hole, and a pattern of adjustable gate resistance structure contact holes by the photoresist through the photolithography process, where the pattern of the source region contact hole is disposed above the source 5 and the body regions 9; and the pattern of the source region contact hole is configured to lead out the source 5 and the body regions 9; the pattern of the gate region contact hole is disposed above the gate polysilicon 8; defining regions of passive region contact holes in the source regions 10 for placing gate metal blocks; the pattern of the adjustable gate resistance structure contact holes are disposed above the gate resistor adjustable structure and is configured to connect the gate region and the adjustable gate resistance structure;

S12: etching the silicon dioxide dielectric layer 12 by the dry etching to obtain the source region contact hole 14, the gate region contact hole 15, and the adjustable gate resistance structure contact holes 15;

S13: depositing a metal as an adhesive layer by a physical vapor deposition (PVD), depositing a metal nitride as a barrier layer; and forming a silicide by a rapid thermal degradation process, wherein the metal comprises one or more of titanium, cobalt, and tantalum;

In the embodiment, the metal is metal tantalum and titanium nitride.

S14: depositing tungsten by a tungsten plug process, removing the tungsten outside the source region contact hole, the gate region contact hole, and the adjustable gate resistance structure contact holes by the dry etching; and forming tungsten plugs 16 in the source region contact hole 14, the gate region contact hole 15, and the adjustable gate resistance structure contact holes 15;

S15: depositing aluminum-copper compounds 17 respectively on the tungsten plugs 16 by the PVD; defining a pattern of a source metal wires, a pattern of a gate metal wires, and a pattern of adjustable gate resistance structure control electrodes by the photoresist through the photolithography process; obtaining the source 5, a gate 6, and the adjustable gate resistance structure control electrodes 4 by the dry etching; and The pattern of the source metal wires is disposed above the source regions 10. The pattern of the gate metal wires is disposed around an edge of a cell region, so that the gate 6 is connected to the region of the passive region contact hole of the source regions 10 through the gate region contact hole 14 to form the gate metal blocks.

The pattern of the adjustable gate resistance structure control electrodes connected the adjustable gate resistance structure in parallel between the gate region contact hole and the gate metal blocks through the adjustable gate resistance structure contact holes and first metal wires. Each of the adjustable gate resistance structure control electrodes is led out between a corresponding independent gate resistor and a corresponding gate metal block.

In the step S15, a line width of second metal wires of joints of independent gate resistor metal wires and corresponding adjustable gate resistance structure control electrode metal wires to be 2 um; the second metal wires are configured to connect to the gate metal blocks.

S16: depositing a passivation layer 18; defining a source metal contact region, a gate metal contact region, and adjustable gate resistance structure control electrode contact regions by the photoresist through the photolithography process; obtaining the source metal contact region, the gate metal contact region, and the adjustable gate resistance structure control electrode contact regions through the dry etching.

The independent gate resistors. The passivation layer is silicon dioxide, silicon dioxide, or a combination of silicon nitride and silicon dioxide.

A first-type doping and a second-type doping are opposite doping types. If the first-type doping is N-type doping, then the second-type doping is P-type doping. If the first-type doping is P-type doping, then the second-type doping is N-type doping.

The present disclosure further provides a super junction power device with an adjustable gate resistance structure. The super junction power device is manufactured by the manufacturing method mentioned above.

In the embodiment, the silicon substrate 1 is a first-type silicon substrate, the intrinsic epitaxial layer 2 is a first-type intrinsic epitaxial layer. The column-shaped region patterns 3 are second-type doping patterns. The body regions 9 are second-type body regions, and the source region 10 is a first-type source region. The first-type and the second-type are opposite doping types. If one first-type element is defined as an N-type element, then a second-type element is defined as a P-type element, and if the first-type element is defined as a P-type element, then the second-type element is the N-type element.

Finally, the super junction power device with the adjustable gate resistance structure is obtained. There is no need to change a layout of the gate, the contact holes, and metal wire layers for different gate resistance requirements, and is no need to re-make masks or tape out, which reduces costs. Further, through each of the adjustable gate resistance control electrodes 4, open-circuit control is performed on the corresponding independent gate resistor to realize an adjustment of the corresponding gate resistor 11.

Specific embodiments of the present disclosure are described above. It should be understood that the present disclosure is not limited to the specific embodiments described above, and those skilled in the art can make various changes or modifications within the scope of the claims, which does not affect the essential content of the present disclosure. In the case of no conflict, the embodiments of the present disclosure and the features in the embodiments may be combined with each other.

What is claimed is:

1. A manufacturing method of a super junction power device with an adjustable gate resistance structure, comprising steps:

A: preparing a cell structure and an adjustable gate resistance structure of the super junction power device;

B: preparing contact through holes;

C: preparing a metal wire layer; and

D: preparing a passivation layer;

wherein the step A comprises steps:

S1: depositing an intrinsic epitaxial layer on a surface of a silicon substrate by chemical vapor deposition (CVD); doping first-type ions on the intrinsic epitaxial layer through an ion implantation process;

S2: depositing a first mask on an upper surface of the intrinsic epitaxial layer, where the first mask is a photoresist or a multi-layer combined structure composed of a photoresist and other insulator masks;

S3: defining column-shaped region patterns on the first mask by photolithography process;

doping second-type ions on the intrinsic epitaxial layer through the ion implantation process;

removing the first mask by dry etching and wet etching;

S4: performing the steps S1-S3 repeatedly;

S5: growing a gate oxide layer by thermal oxidation method, and then depositing gate polysilicon by low-pressure CVD, where the gate polysilicon is a first-type in-situ doped gate polysilicon;

S6: depositing a second mask on the gate polysilicon, where the second mask is the photoresist or the multi-layer combined structure composed of the photoresist and other insulator masks; defining a gate pattern on the second mask by the photolithography process, forming a gate structure by the dry etching; and removing the second mask by the dry etching and the wet etching;

S7: injecting the first-type ions on the upper surface of the intrinsic epitaxial layer by the ion implantation process; and activating the first-type ions in the intrinsic epitaxial layer by a thermal process to obtain body regions;

S8: depositing a third mask on an upper surface of a doped intrinsic epitaxial layer, where the third mask is the photoresist or the multi-layer combined structure composed of the photoresist and other insulator masks; defining a pattern of source regions on the third mask by the photolithography process; injecting the first-type ions on upper surfaces of the body regions by the ion implantation process to obtain a source; removing the third mask by the dry etching and the wet etching; activating the first-type ions in the source regions by the thermal process; and S9: injecting the second-type ions on the upper surface of the intrinsic epitaxial layer through the ion implantation process to obtain an ohmic contact region, where the ohmic contact region is highly doped, and finally obtaining the cell structure and the adjustable gate resistance structure;

wherein the gate pattern defines a gate pattern of a cell region metal oxide field effect transistor and adjustable gate resistance structure pattern regions; the adjustable gate resistance structure pattern regions are independent patterns of gate resistors with a line width of 5 μm; the adjustable gate resistance structure pattern regions are connected in series to three independent gate resistors connected in parallel in a gate loop to make an adjusting range of a resistance of the independent gate resistors to be 1-30Ω.

2. The manufacturing method according to claim 1, wherein in the steps S1, S3, S7, S8 and S9, a doping type of the first-type ions is opposite to a doping type of the second-type ions; the first-type ions are N-type ions or P-type ions, and the second-type ions are according P-type ions or N-type ions; the P-type ions are trivalent boron element and the N-type ions are pentavalent arsenic element or pentavalent phosphorus element.

3. The manufacturing method according to claim 1, wherein in the step S4, steps S1-S3 are repeatedly performed until a thickness of the intrinsic epitaxial layer is 30-70 um.

4. The manufacturing method according to claim 1, wherein a thickness of the gate oxide layer in the step S5 is 50-200 nm; a thickness of the gate polysilicon in the step S5 is 500-1000 nm.

5. The manufacturing method according to claim 1, wherein the step B specifically comprises following steps:

S10: forming a silicon dioxide dielectric layer by the CVD;

S11: defining a pattern of a source region contact hole, a pattern of a gate region contact hole, and a pattern of adjustable gate resistance structure contact holes by the photoresist through the photolithography process, where the pattern of the source region contact hole is disposed above the source and the body regions; and the pattern of the source region contact hole is configured to lead out the source and the body regions; the pattern of the gate region contact hole is disposed above the gate polysilicon; defining regions of passive region contact holes in the source regions for placing gate metal blocks; the pattern of the adjustable gate resistance structure contact holes are disposed above the gate resistor adjustable structure and is configured to connect the gate region and the adjustable gate resistance structure;

S12: etching the silicon dioxide dielectric layer by the dry etching to obtain the source region contact hole, the gate region contact hole, and the adjustable gate resistance structure contact holes;

S13: depositing a metal as an adhesive layer by a physical vapor deposition (PVD), depositing a metal nitride as a barrier layer; and forming a silicide by a rapid thermal degradation process, wherein the metal comprises one or more of titanium, cobalt, and tantalum; and S14: depositing tungsten by a tungsten plug process, removing the tungsten outside the source region contact hole, the gate region contact hole, and the adjustable gate resistance structure contact holes by the dry etching; and forming tungsten plugs in the source region contact hole, the gate region contact hole, and the adjustable gate resistance structure contact holes.

6. The manufacturing method according to claim 1, wherein the step C comprises:

S15: depositing aluminum-copper compounds respectively on the tungsten plugs by the PVD; defining a pattern of a source metal wires, a pattern of a gate metal wires, and a pattern of adjustable gate resistance structure control electrodes by the photoresist through the photolithography process; obtaining a source, a gate, and the adjustable gate resistance structure control electrodes by the dry etching;

wherein the pattern of the source metal wires is disposed above the source regions; the pattern of the gate metal wires is disposed around an edge of a cell region, so that the gate is connected to the region of the passive region contact hole of the source regions through the gate region contact hole to form the gate metal blocks;

wherein the pattern of the adjustable gate resistance structure control electrodes connected the adjustable gate resistance structure in parallel between the gate region contact hole and the gate metal blocks through the adjustable gate resistance structure contact holes and first metal wires; and each of the adjustable gate resistance structure control electrodes is led out between a corresponding independent gate resistor and a corresponding gate metal block, and the adjustable gate resistance structure control electrodes are one-to-one corresponding to the independent gate resistors.

7. The manufacturing method according to claim 6, wherein in the step S15, a line width of second metal wires of joints of independent gate resistor metal wires and corresponding adjustable gate resistance structure control electrode metal wires to be 1-2 um; the second metal wires are configured to connect to the gate metal blocks.

8. The manufacturing method according to claim 1, wherein the step D comprises:

S16: depositing the passivation layer; defining a source metal contact region, a gate metal contact region, and adjustable gate resistance structure control electrode contact regions by the photoresist through the photolithography process; obtaining the source metal contact region, the gate metal contact region, and the adjustable gate resistance structure control electrode contact regions through the dry etching;

wherein the adjustable gate resistance structure control electrode contact regions are one-to-one corresponding the independent gate resistors; the passivation layer comprises silicon nitride and/or silicon dioxide.

9. A super junction power device with an adjustable gate resistance structure, wherein the super junction power device is manufactured by the manufacturing method according to claim 1.

* * * * *